(12) United States Patent
Faust et al.

(10) Patent No.: US 9,082,649 B2
(45) Date of Patent: Jul. 14, 2015

(54) PASSIVATION PROCESS TO PREVENT TIW CORROSION

(71) Applicant: Texas Instruments Incorporated, Dallas, TX (US)

(72) Inventors: Richard Allen Faust, Dallas, TX (US); Joseph Nguyen, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/552,745

(22) Filed: Nov. 25, 2014

(65) Prior Publication Data

US 2015/0145125 A1 May 28, 2015

Related U.S. Application Data

(60) Provisional application No. 61/908,283, filed on Nov. 25, 2013.

(51) Int. Cl.
H01L 21/4763 (2006.01)
H01L 23/48 (2006.01)
H01L 23/00 (2006.01)
H01L 23/532 (2006.01)
H01L 21/768 (2006.01)
H01L 23/498 (2006.01)

(52) U.S. Cl.
CPC .......... *H01L 24/11* (2013.01); *H01L 21/76843* (2013.01); *H01L 23/53233* (2013.01); *H01L 23/53238* (2013.01); *H01L 24/13* (2013.01); *H01L 23/49838* (2013.01); *H01L 24/20* (2013.01); *H01L 2224/11005* (2013.01); *H01L 2924/014* (2013.01); *H01L 2924/01028* (2013.01); *H01L 2924/01029* (2013.01); *H01L 2924/0132* (2013.01)

(58) Field of Classification Search
CPC ........... H01L 2224/06505; H01L 2924/01029; H01L 24/05; H01L 24/12; H01L 24/13; H01L 24/06; H01L 24/14; H01L 24/20; H01L 23/49838; H01L 23/53233; H01L 24/17; H01L 24/24; H01L 23/53238
See application file for complete search history.

(56) References Cited

U.S. PATENT DOCUMENTS

| | | | |
|---|---|---|---|
| 7,915,741 B2 | 3/2011 | Lau et al. | |
| 8,580,672 B2 * | 11/2013 | Kuechenmeister et al. | .. 438/613 |
| 2009/0108443 A1 * | 4/2009 | Jiang | 257/737 |
| 2009/0166861 A1 * | 7/2009 | Lehr et al. | 257/737 |
| 2014/0061897 A1 * | 3/2014 | Lin et al. | 257/737 |

* cited by examiner

Primary Examiner — Alonzo Chambliss
(74) Attorney, Agent, or Firm — Jacqueline J. Garner; Frank D. Cimino

(57) ABSTRACT

Disclosed is an under bump metallization structure including a plurality of metal or metal alloy layers formed on chip bond pads with improved reliability due to a sacrificial metal oxide and the methods of making the under bump metallization structures. A barrier layer is formed over a bond pad. A seed layer is formed over the barrier layer. A bump resist pattern is formed exposing an area over the bond pad and a metal layer is electroplated on the seed layer.

12 Claims, 5 Drawing Sheets

PASSIVATION PROCESS TO PREVENT TIW CORROSION

CROSS-REFERENCE TO RELATED APPLICATIONS

This application claims the benefit of priority under U.S.C. §119(e) of U.S. Provisional Application 61/908,283 (filed Nov. 25, 2013), hereby incorporated by reference.

FIELD OF THE INVENTION

This disclosure relates generally to semiconductor devices and the methods of formation, and more particularly to a reliable under bump metallization (UBM) having multiple metal or metal alloy layers.

BACKGROUND OF THE INVENTION

Interconnections between semiconductor-based integrated circuits, commonly referred to as "chips" and package leads are performed by wire bonding, solder bumps or tape automated bonding (TAB). Among them, the wire bonding technique is most commonly used because of its low cost. However, when the size of the chip-package interconnection scales down, the performance and reliability of wirebonding may be affected since wirebonding requires the routing of all the input/output (I/O) connections to the edges of the chip.

Solder bumping is the use of reflowable solder balls to join contacts on the chip with corresponding contacts on the package. It provides a useful alternative to the traditional wirebonding technology. The solder bumps are normally deposited on the bond pads located on the top side of the substrate that carries the chip. Between the solder bump and the chip, however, there is typically an UBM (under bump metallization) structure.

The UBM structure serves as an electrical and mechanical interface between the bond pad and the solder bump. It provides needed adhesion and also serves as a diffusion barrier between the solder bump and the bond pad.

Most UBM structures include multiple layers of metal or metal alloys. Copper is a commonly used metal in the UBM structures. It increases bondability and wettability of the solder. It is known that tin in the solder bump reacts with copper in the UBM structure by heat generated either in the course of reflow or during the use of the chip to form an intermetallic compound. Since the formed intermetallic compound is brittle, the bonding strength between the solder bump and the bond pad would be greatly compromised if copper is in direct contact with the solder bump.

Nickel has been incorporated into UBM structures to protect the copper layer. The UBM structures including the nickel layer prevent copper from coming in direct contact with the solder bump.

There is still a need for an UBM structure that has a thin copper layer while at the same time has good wettability and bondability.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, a method of fabricating an integrated circuit having an under bump metallization structure is provided. A passivation layer is formed over a surface of the integrated circuit including over a bond pad and patterned to expose a portion of the bond pad. A barrier layer (e.g. TiW) is formed over the passivation layer and the bond pad and a seed layer (e.g., Cu) is formed over the barrier layer. A metal oxide layer (e.g., CuO) is formed on the seed layer to prevent corrosion of the seed layer during the bump pattern step. Then, a bump resist pattern is formed over the metal oxide layer. After forming the bump resist pattern, the metal oxide layer exposed by the bump resist pattern is removed and a metal layer (e.g., Cu) is formed on the seed layer.

In accordance with another embodiment of the present application, an under bump metallization structure is provided. The under bump metallization structure comprises: a passivation layer disposed over the bond pads and top layer of an integrated circuit, wherein a portion of the passivation layers cover a portion of the bond pads; a barrier disposed over the bond pads and a seed layer disposed over the barrier layer, wherein the integrated circuit contains no blue vias due to corrosion of the seed layer from the barrier layer.

DESCRIPTION OF THE VIEWS OF THE DRAWING

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
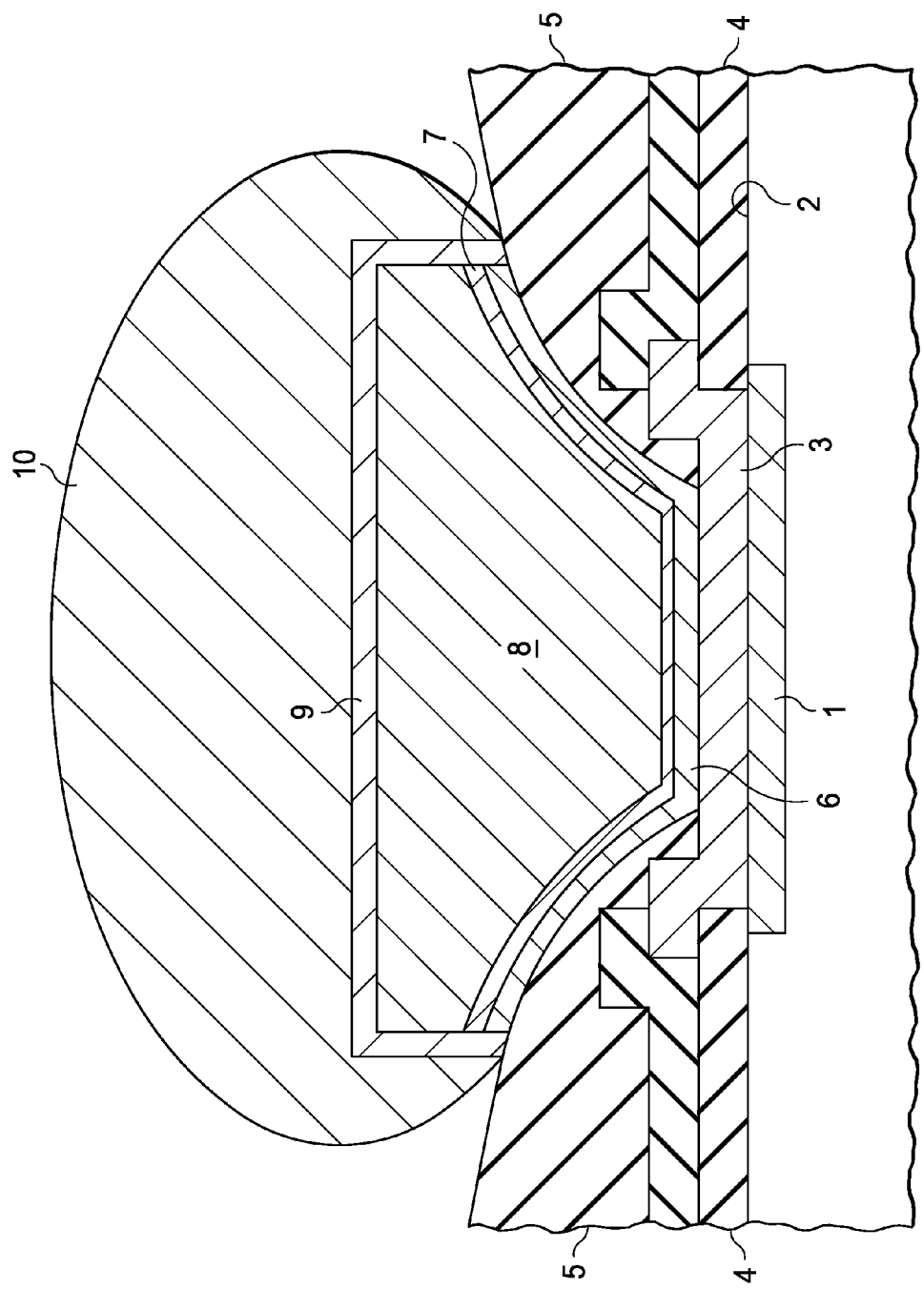
FIG. 1 illustrates a cross-sectional view of an isolated portion of a semiconductor structure.

FIG. 1 illustrates a cross-sectional view of an isolated portion of a semiconductor structure formed on substrate 1 according to one embodiment of the disclosure. As shown in FIG. 1, on surface 2 of substrate 1, there is a bond pad 3. Bond pad 3 can be formed via any conventional means. It is made of a conductive material. Most commonly used is Al or Cu.

There is at least one passivation layer 4 formed over substrate 1 and bond pad 3. Passivation layer 4 in FIG. 1 is normally formed of an insulation material such as silicon oxide and silicon nitride. Electrical isolation is the primary function of passivation layer 4. It also serves to keep out dust and moisture to protect the chip from corrosion and other damages. Dielectric layer 5 on top of passivation layer 4 is made of an organic material preferably polyimide. Dielectric layer 5 is compliant and may serve as a stress buffer layer.

There is an aperture formed in dielectric layer to expose at least a portion of bond pad 3. The aperture can be any shape and size. When multiple passivation layers are used, at least a portion of each passivation layer is also exposed.

The UBM structure is composed of a plurality of metal layers formed on bond pad 3 where no two adjacent layers are formed of same metal or metal alloy. The first metal or metal alloy layer 6, disposed on bond pad 3 and part of passivation layers 4 and 5, is preferably titanium-base. By base, it is meant that at least 50% of the alloy is the specified metal, in this instance, titanium. It provides good adhesion between bond pad 3 and second metal or metal alloy layer 7. For example, metal alloy 6 may comprise TiW.

Layer 7, disposed over layer 6, is preferably copper-base. This layer provides good electrical connection between solder bump 10 and bond pad 3. It has a thickness of about 0.1 to 10 microns, and preferably from about 0.2 to 0.5 microns. The copper layer according to the instant disclosure is thin since it is a seed layer for layer 8.

A third metal or metal alloy layer, layer 8, is disposed over layer 7. It is preferably made of copper and has a thickness of from about 0.1 micron to 20.0 microns.

A fourth metal or metal alloy layer, layer 9, is disposed over layer 8. It is preferably made of nickel-base and has a thickness of from about 1.0 micron to 5.0 microns. Layer 9 serves as a good barrier for intermetallic formation between layer 8 and solder bump 10. Even though the nickel-base layer is very thin, this layer serves to increase wettability and bondability of the UBM structure and prevent contamination of layer 8.

Each layer of the UBM structure can be formed using any conventional fabrication techniques, for example, sputtering, evaporation and plating processes. Solder bump 10 can be disposed over layer 9 through the use of screen-printing technology or solder sphere drop technique.

Bump reliability improvement is achieved by intentionally growing a sacrificial Cu oxide (15 Å-100 Å) on the UBM Cu seed deposition and leaving the Cu oxide in place through the bump pattern process. The Cu oxide exposed by the bump resist pattern is then removed prior to electroplating additional layers. As a result of the sacrificial Cu Oxide, corrosion of the seed layer by the barrier layer (TiW) is prevented such that the integrated circuit contains no blue vias. Blue vias result from a blue-colored corrosion of the seed layer by the underlying TiW layer. Without the Cu oxide, this blue-colored corrosion occurs within the via (i.e., area exposed by the bump resist pattern).

Figure 2:
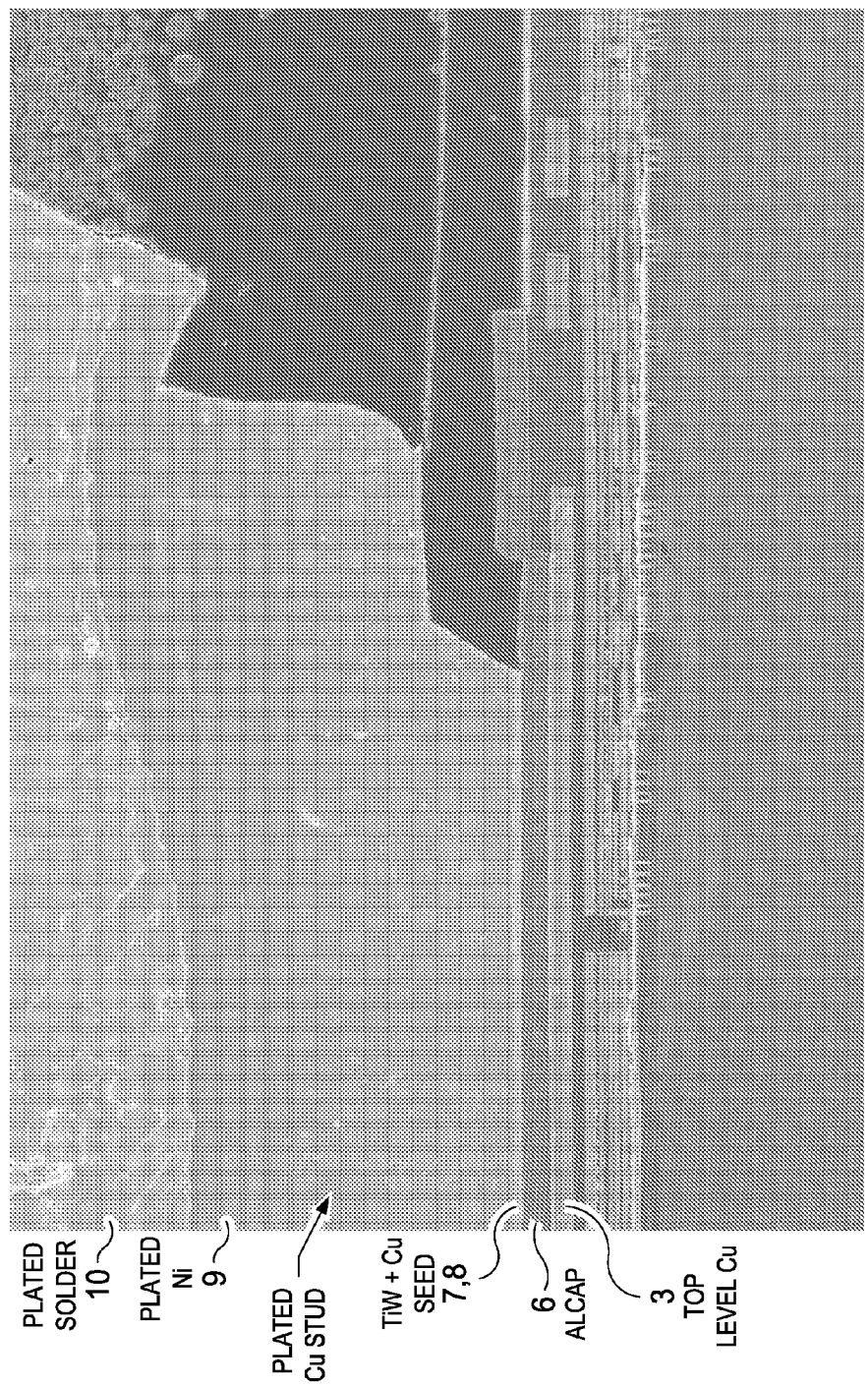
FIG. 2 illustrates a cross-sectional photomicrograph of FIG. 1.
Figure 3:
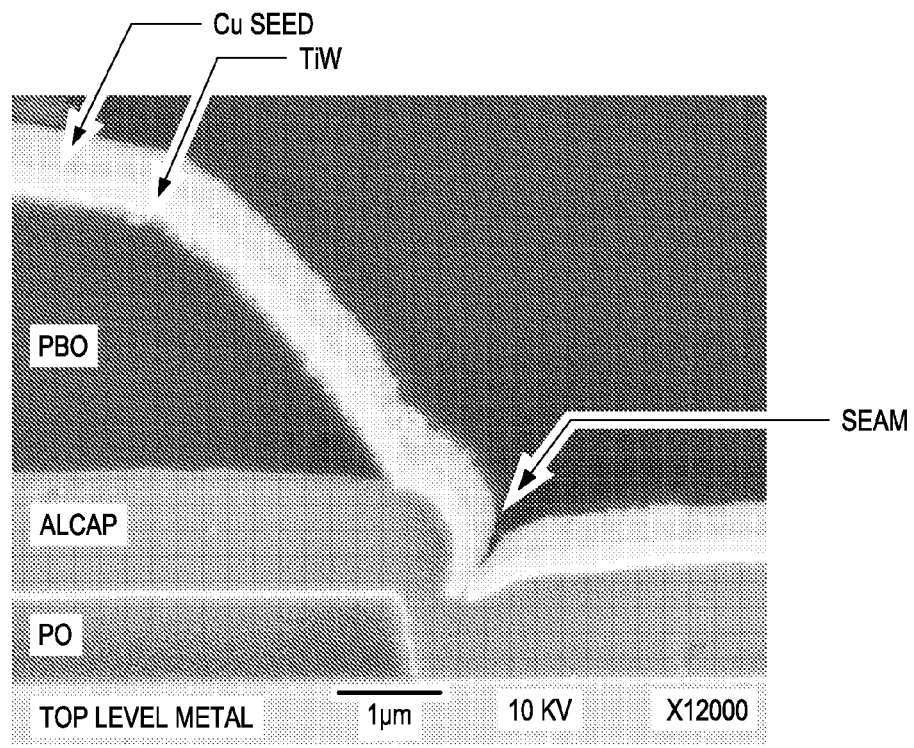
FIG. 3 illustrates the most probable location of the TiW corrosion in accordance with the present invention.
Figure 4:
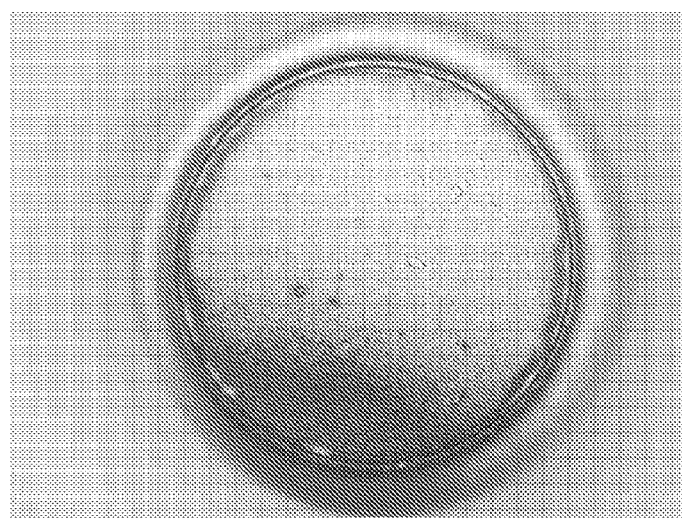
FIG. 4 illustrates a photomicrograph showing the results of the TiW corrosion.
Figure 5:
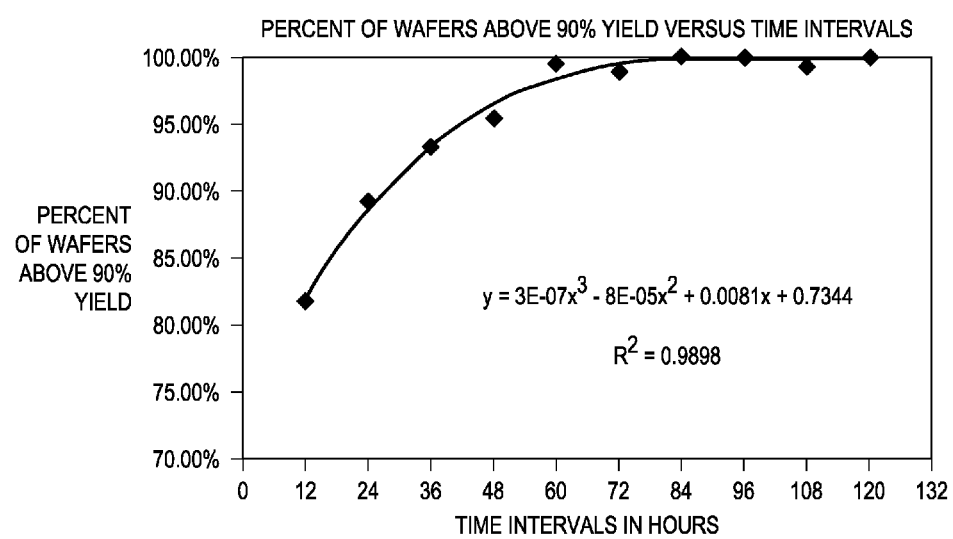
FIG. 5 illustrates the relationship between time from the reactor v.s. TiW corrosion.

FIG. 2 is a photomicrograph of FIG. 1.

Figure 6:
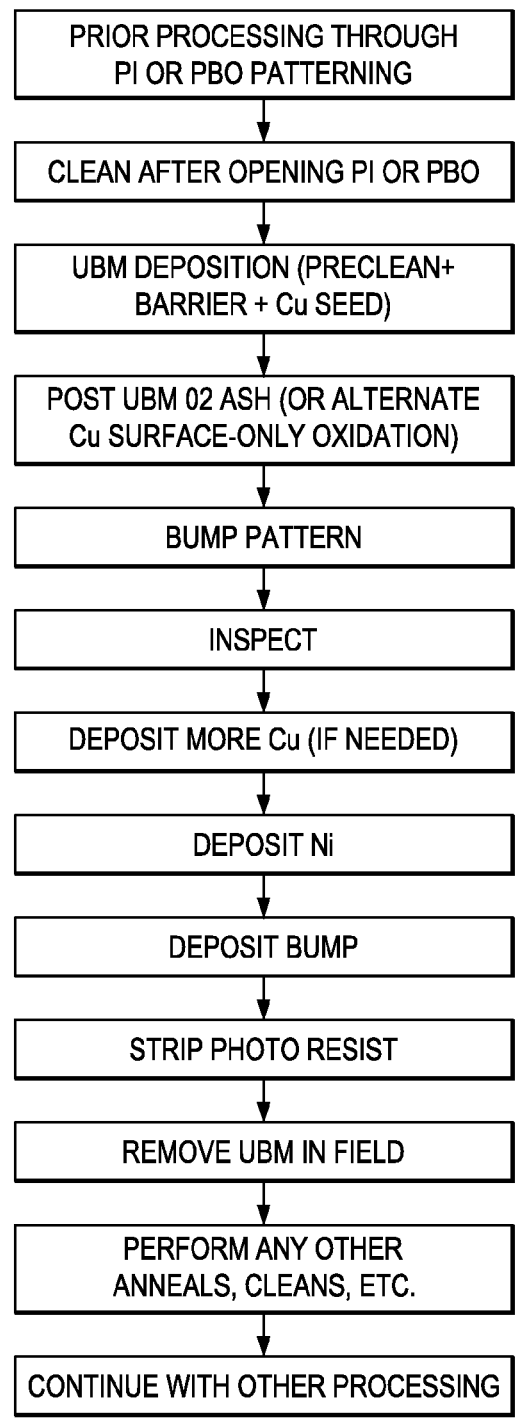
FIG. 6 illustrates the process flow and highlights the step where TiW corrosion can occur and can be eliminated in accordance with the present invention.

In practice, the UBM structure disclosed in this application can be fabricated using the flow diagram in FIG. 6. An integrated circuit is processed through the formation of bond pads, passivation layers over the structure (including the bond pads), and patterning to expose the bond pads (PBO patterning). Clean processed may then be performed as appropriate. UBM formation begins with the deposition of a barrier layer such as TiW and the formation of a copper seed layer.

In order to prevent corrosion/migration from the underlying barrier layer, a Cu oxide is then formed over the Cu seed layer. The ultimate solution is to grow a clean sacrificial Cu oxide (rather than a 3-day native Cu oxide) prior to bump pattern. This may be accomplished by exposing post-UBM seed deposition to an $O_2$ ash to grow ~40 Å CuO (simulates ~30 days of native oxide growth).

After forming the CuO, the bump resist pattern is formed. This may be a photoresist pattern that exposes areas where bump bonds are desired. Once the bump resist pattern is formed, an electroplating step is performed to form additional copper on the seed layer. Prior to electroplating the additional copper, the sacrificial oxide is removed. For example, the electroplater "dwell" step (pre-dep $H_2SO_4$ exposure) may be used to fully dissolve the sacrificial Cu oxide, allowing plating onto an unoxidized Cu surface.

Blue vias (vias with TiW corrosion) were completely eliminated in experiments using $O_2$ ash. The process adjustment allowed all packages to pass all package qual items, including temp cycle, hammer test, A/T MQ, & unbiased HAST.

After depositing (electroplating) the additional copper, a Ni layer may be deposited followed by deposition of the solder bump. Next, the bump resist pattern may be stripped and the Cu oxide, Cu seed, and barrier layer are removed in field areas (outside of the bump areas).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of fabricating an integrated circuit having an under bump metallization structure, comprising the steps of:
    forming a passivation layer over a surface of the integrated circuit including over a bond pad;
    patterning the passivation layer expose a portion of the bond pad;
    forming a barrier layer over the passivation layer and the bond pad;
    forming a seed layer over the barrier layer;
    forming a metal oxide layer on the seed layer;
    forming a bump resist pattern over the metal oxide layer, the bump resist pattern exposing an area over the bond pad;
    after forming the bump resist pattern, removing the metal oxide layer exposed by the bump resist pattern; and
    electroplating a metal layer on the seed layer.

2. The method of claim 1, wherein the step of forming the metal oxide layer comprises performing an $O_2$ ash on the seed layer.

3. The method of claim 2, wherein the barrier layer is TiW.

4. The method of claim 3, wherein the metal oxide layer is copper oxide.

5. The method of claim 4, wherein the step of removing the metal oxide layer comprises exposing the copper oxide to $H_2SO_4$ in an electroplater.

6. The method of claim 5, further comprising the step of forming a Ni layer over the metal layer.

7. The method of claim 6, further comprising the step of forming a solder bump on the Ni layer.

8. The method of claim 7, further comprising the steps of:
removing the bump resist pattern; and
removing portions of the metal oxide, seed layer and barrier layer outside of the solder bump.

9. A method of fabricating an integrated circuit having an under bump metallization structure, comprising the steps of:
forming a passivation layer over a surface of the integrated circuit including over a bond pad;
patterning the passivation layer expose a portion of the bond pad;
forming a TiW layer over the passivation layer and the bond pad;
forming a Cu seed layer over the TiW layer;
forming a Cu oxide layer on the Cu seed layer;
forming a bump resist pattern over the Cu oxide layer, the bump resist pattern exposing an area over the bond pad and covering a field area;
after forming the bump resist pattern, performing an electroplating process to form a Cu layer over the Cu seed layer, wherein a first step in the electroplating process removes the Cu oxide layer exposed by the bump resist pattern;
forming a Ni layer over the Cu layer; and
removing the bump resist pattern.

10. An integrated circuit having an underbump metallization structure that comprises:
a plurality of metal layers formed on a bond pad, wherein no two adjacent layers are formed of same metal or metal alloy;
a passivation layer disposed over the bond pads and top layer of an integrated circuit, wherein a portion of the passivation layer covers a portion of the bond pads;
wherein a barrier layer of the plurality of metal layers is disposed over the bond pads, wherein the barrier layer is preferably titanium-base, wherein a seed layer of the plurality of metal layer is formed on the barrier layer, and wherein the integrated circuit contains no blue vias.

11. The underbump metallization structure as recited in claim 10, wherein a third metal layer of the plurality of metal layers is disposed over the seed layer of metal.

12. The underbump metallization structure as recited in claim 11, a fourth metal layer is disposed over third metal or metal alloy layer.

* * * * *